(12) United States Patent
Trunz et al.

(10) Patent No.: US 6,392,825 B1
(45) Date of Patent: May 21, 2002

(54) ASSEMBLY COMPRISING AN OPTICAL ELEMENT AND A MOUNT

(75) Inventors: Michael Trunz, Ellwangen; Ralf Hilgers; Bernhard Gellrich, both of Aalen, all of (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/491,666

(22) Filed: Jan. 27, 2000

(30) Foreign Application Priority Data

Feb. 3, 1999 (DE) .......................................... 199 04 152

(51) Int. Cl.⁷ ................................................ G02B 7/02
(52) U.S. Cl. ....................... 359/819; 359/811; 359/820; 359/822
(58) Field of Search ................................. 359/819, 811, 359/820, 822

(56) References Cited

U.S. PATENT DOCUMENTS

| | | | |
|---|---|---|---|
| 2,808,765 A | * 10/1957 | Gunderson | 409/86 |
| 4,017,878 A | 4/1977 | Hagiwara | 354/286 |
| 4,161,120 A | 7/1979 | Cloarec | 73/494 |
| 5,117,311 A | * 5/1992 | Nomura | 359/819 |
| 5,428,482 A | * 6/1995 | Bruning et al. | 359/827 |
| 6,130,789 A | * 10/2000 | Aarts et al. | 359/819 |
| 6,215,603 B1 | * 4/2001 | Kohno et al. | 359/819 |

FOREIGN PATENT DOCUMENTS

| | | | |
|---|---|---|---|
| DE | 1 262 041 | * | 2/1968 |
| DE | 196 32 265 A1 | * | 2/1997 |
| EP | 0 230 277 A2 | | 1/1987 |
| EP | 0 243 893 B1 | | 4/1987 |
| JP | 58087504 | * | 12/1981 |

* cited by examiner

*Primary Examiner*—Georgia Epps
*Assistant Examiner*—Tim Thompson
(74) *Attorney, Agent, or Firm*—Welsh & Katz, Ltd.

(57) ABSTRACT

An assembly is provided with a mount (1) and an optical element (7). The optical element (7) is connected via elastic connecting elements directly or via one or more intermediate elements to the mount (1). The connecting elements have at least one membrane-like joining element (4), which is connected in the outer region to the mount (1) or to the intermediate element and in the inner region is connected via a rigid, moment-transferring connection (12) to the optical element (7).

36 Claims, 3 Drawing Sheets

ASSEMBLY COMPRISING AN OPTICAL ELEMENT AND A MOUNT

The invention concerns an assembly comprising an optical element and a mount.

BACKGROUND OF THE INVENTION

Assemblies of this type, in particular lens systems as the optical element, in which the connection of the lenses to a mount surrounding them takes place by means of elastic connecting elements, are generally known.

U.S. Pat. No. 5,248,482 relates to the isolation of an optical element from a mount by means of elastic bar-like connecting elements between the optical element and the mount.

EP 0 230 277 A2 concerns a precision lens mounting with elastic bending elements in the form of bars between the optical element and the mount likewise being provided. The elastic bending elements are intended to make radial compliance possible to compensate for thermal stresses.

Something similar applies to EP 0 243 893 B1, in which a lens mounting for positioning lenses is described, with a multiplicity of bending devices designed in the manner of leaf springs holding a lens as an optical element on a mount.

SUMMARY OF THE INVENTION

The present invention is based on the object of providing a connecting technique between an optical element and a mount holding the latter, the optical element being connected to the mount via elastic links in such a way as to provide, at least to a great dextent, freedom from stress or low stress and consequently a reduction in the surface deformation of the optical element, along with a geometrically simple design.

This object is achieved according to the invention by the features.

The connection by means of the membrane-like joining element via a rigid, moment-transferring connection allows differences in stress to be reduced or no longer to occur during installation. This also means that deformations or tolerance inaccuracies of the flange do not affect the optical element, for example a lens.

The membrane-like joining element according to the invention has the effect during installation of achieving great elasticity of compliance in the z direction, i.e., in the direction of the optical axis. In this way, the optical element can be aligned exactly on the joining element in a low-stress manner. If, subsequently, a secure connection is established between the joining element and the optical element, to be precise a rigid, moment-transferring connection according to the invention, the bending angle thereby obtained between the joining element and the optical element is virtually fixed, whereby further bending may bot readily take place when loading occurs, i.e. angular changes are no longer possible. By establishing a secure connection, the degrees of freedom for moments at the connecting point are blocked. Consequently, when external forces and moments occur, there is a buckling stress, the inflexibility of which is significantly greater than that of pure bending, as a result of which the required natural frequency and stability are ensured.

A simple structural design for achieving the object set may be that the joining element comprises a membrane ring or a plurality of ring segments which are put together to form a closed membrane ring. In this way a clear reduction in surface deformations of the optical element is achieved.

BRIEF DESCRIPTION OF THE DRAWINGS

Advantageous developments and designs of the invention emerge from the subclaims and form the exemplary embodiment described in principle below on the basis of the drawing, in which:

DETAILED DESCRIPTION OF THE PREFERRED EMBODIMENT

Figure 1:
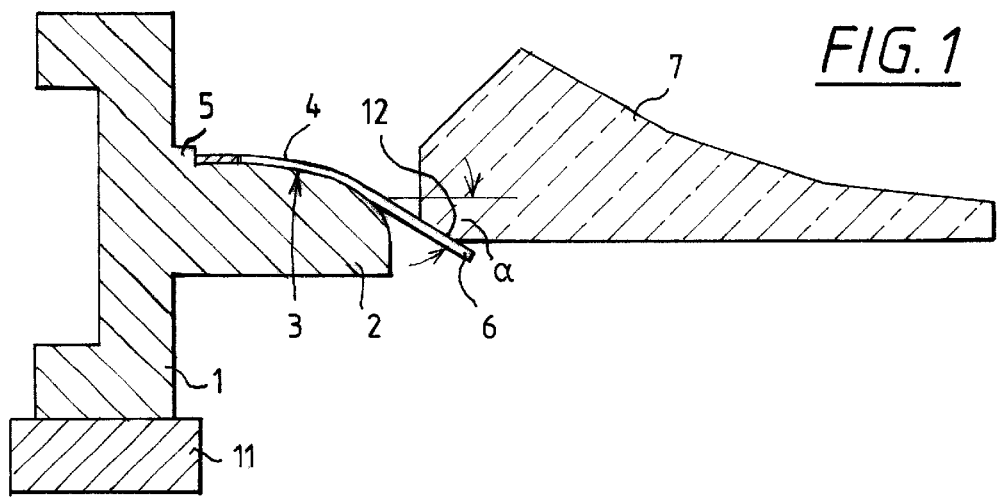
FIG. 1 shows a detail of a section through an assembly with a mount and a lens as the optical element.
Figure 2:
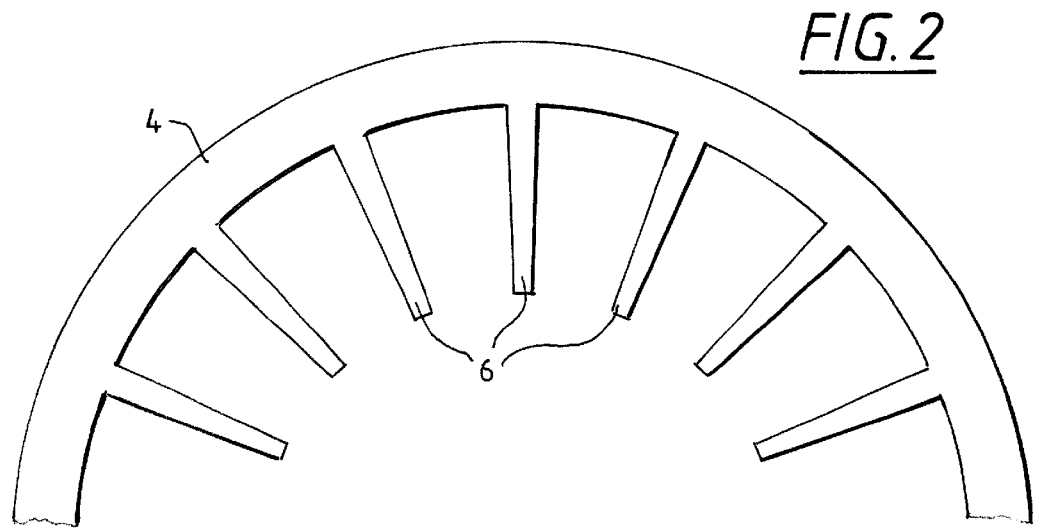
FIG. 2 shows a detail of a plan view of a membrane-like joining element with butt straps.

An annular mount 1 is provided on the inside with an annular shoulder 2, which has a resting contour 3 extending in a way at least approximately corresponding to the bending line of a joining element 4. A membrane ring 4 as the joining element rests on the resting contour 3 and is securely connected to the mount 1 in a positive and/or non-positive manner (for example by welding, soldering or adhesive bonding). Serving here for exact centering and as a stop is a centering collar 5 at the rear end of the resting contour 3. Protruding inward from the membrane ring 4, from its inner circumference, are a multiplicity of butt straps 6. The butt straps 6 serve as a rest for a lens 7 as the optical element. The membrane ring 4 with the butt straps 6 is produced from a resilient material, for example a very thin metal sheet with a thickness of 0.3 to 0.5 mm. The butt straps, which are integrally connected to the membrane ring 4, may in this case have a still thinner thickness of, for example, 0.1 to 0.3 mm.

Cold-rolled strips of high-grade steel, titanium alloys or nitinol-nickel-titanium alloys, which are also referred to as memory alloys, may be used for example as metal sheets for the membrane ring 4 with the butt straps 6. In particular, an alloy with superelastic properties is suitable for the intended purpose, since these alloys permit great deformations in a small structural space. The joining element, i.e. the membrane ring 4, may also be provided with the integration or application of an intelligent material (smart material, for example shape memory—or piezoelectric elements), so that influencing of the state of deformation of the optical element, or sensing of the same, is possible by supplying energy. The membrane ring may be produced by an etching technique, which is advantageous in particular if it is provided with numerous contours, as can be seen for example from FIG. 3.

Figure 3:
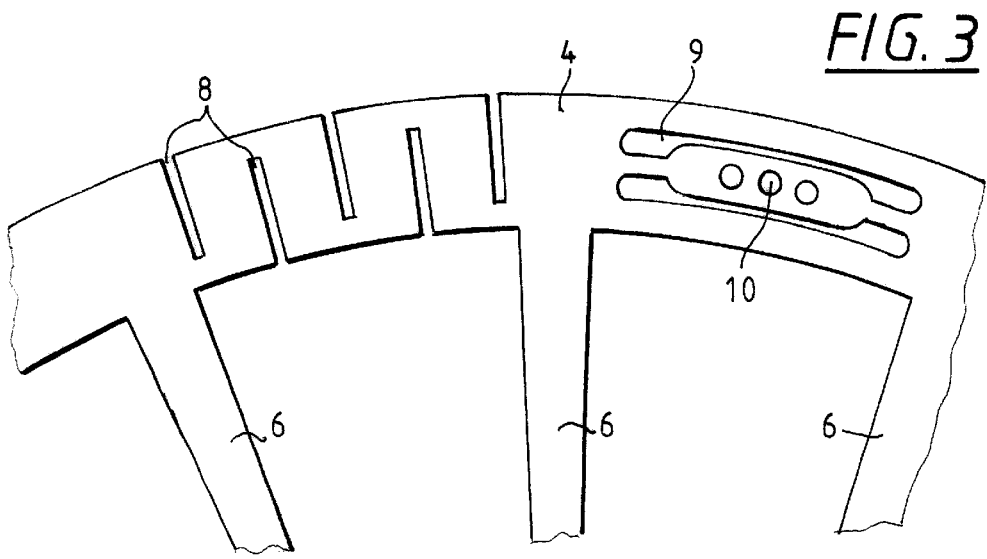
FIG. 3 shows a further design of a membrane-like joining element in plan view (in the form of a detail)

FIG. 3 shows a membrane ring 4 with butt straps 6, radially or tangentially extending slits 8 having been formed in the membrane ring 4 alternately from the outer circumference and from the inner circumference. The slits 8 serve the purpose of avoiding distortion of the membrane ring 4 when the latter is connected to the mount 1, for example by welding, with the resultant stresses. Alternatively or else in addition to this, the membrane ring 4 may also be provided with relief pockets 9, arranged such that they are distributed around the circumference. The relief pockets 9 may be designed in any way desired, with for example grooves of different cross section extending in the circumferential direction and with relief bores 10 lying between the grooves.

The optical assembly can be put together in a simple way and very precisely with respect to the position of the lens 7. In a first step, the mount 1 is clamped onto a rigid, planar mating flange 11. Subsequently the membrane ring 4 is fastened on the resting contour 3, for example by welding. In a next step, the lens 7 is placed onto the butt straps 7 and aligned in a known straightening and joining operation. Once the straightening and joining operation has been completed, it being possible on account of the great elasticity of the membrane ring 4 or the butt straps 6 for the lens 7 to rest without any stress or deformation, a rigid connection between the lens 7 and the membrane ring 4 or the butt straps 6 of the latter takes place, for example by means of adhesive bonding or soldering, at a connection 12.

The connection 12 which is established in this way, which can consequently also transfer moments, has the effect of giving the membrane ring 4 with the butt straps great rigidity, to be precise on account of the bend geometrical shape after the secure connection to the lens. In practice a fixed angle a, which can no longer change, is obtained in the region of the connection 12. As a result of the fact that the angle a can no longer change, when forces occur the only possibility for the membrane ring 4 or the butt straps 6 is that of a slight S-shaped bending or buckling. It has been achieved in this way that a very great deformation is possible during installation, but after the joining operation there is great rigidity, so that a positioning of the lens 7 with adequate accuracy and stability is achieved.

The geometrical design of the joining element, for example as a membrane ring 4 with butt straps 6, can be varied to a great extent according to the application. For example, the geometrical shape of the membrane ring 4 may be defined on one occasion and then remain the same for a lens system in its totality. It is then merely necessary to adapt the required diameters to the lenses. The number and shape of butt straps 6 is dependent n the lens mass and the metal sheet thickness and can likewise be varied. The same applies to the membrane ring 4, which may be designed as a closed ring, provided with slits, such as the slits 8 for example, or else be formed from individual segments, for example 90° angle segments.

Figure 4:
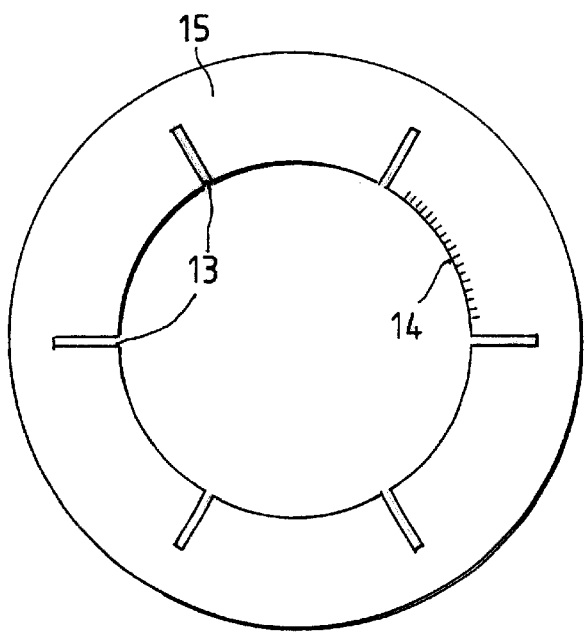
FIG. 4 shows a plan view of a third design of a membrane-like joining element.

Production from a plurality of individual segments is particularly suitable if it is desired to achieve very great precision and it is wished to avoid different elasticities on account of the known anisotropy of rolled metal sheets, which leads to uneven bending of the membrane ring 4 and/or of the butt straps 6. Represented in this respect in FIG. 4 is a membrane ring 4, which is provided for example with only 6 incisions 13, whereby only 6 butt-strap-like resting surfaces are formed for the lens 7. In addition, to increase the elasticity, a multiplicity of shorter incisions 14 may also be provided between the incisions 13, from the inner circumference. Also indicated in FIG. 4, by dashed lines, is that the membrane ring 4 may be formed from 4 individual segments 15.

If even greater rigidity in the z direction, i.e., in the direction of the optical axis, is to be achieved, force-free centering of the lens 7 can also take place by means of pins 16. The pins 16 are inserted in bores of a supporting ring 17 that are distributed over the circumference and are arranged with their longitudinal axes 7 in the z direction. The supporting ring 17 is connected in the outer region to the mount 1, for example by means of screws. At the same time, this type of connection may also form the fastening of the membrane ring 4 to the mount.

The pins 16 have an L shape, the angled-away part of the latter extending at right angles to the z axis and being connected by the free end to the circumferential wall of the lens 7 is aligned in the z direction, the pins 16 are fixed in their positions in the bores of the supporting ring 17, which may take place for example by adhesive being introduced into the bores.

Figure 5:
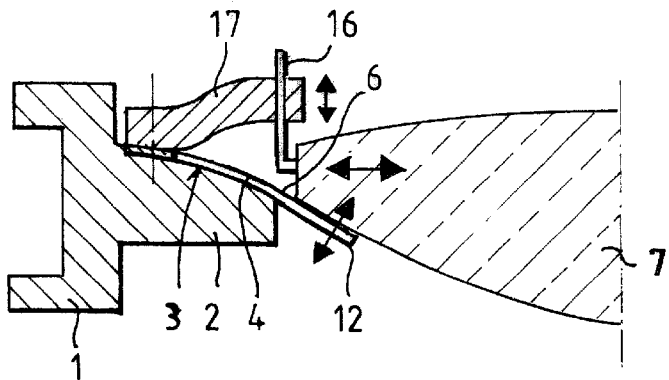
FIG. 5 shows a detail of a section through a further design of an assembly with a mount and an optical element.

The increase in rigidity in the z direction, represented in FIG. 5, is intended for an assembly which is vertically arranged.

Figure 6:
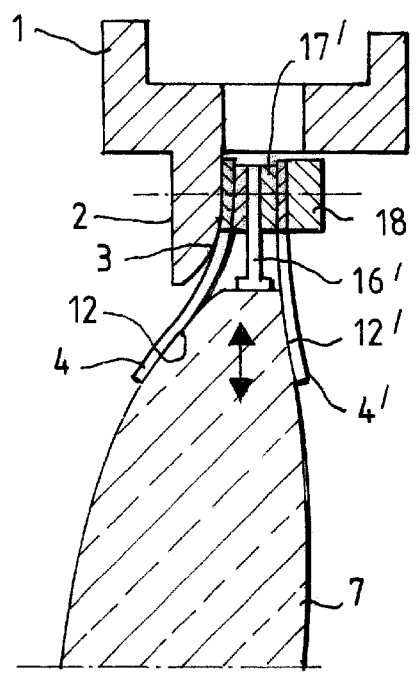
FIG. 6 shows a detail of a section through a third design of an assembly with a mount and a lens as the optical element, with the lens in a horizontal arrangement.

FIG. 6 shows an arrangement in which the lens 7 is arranged vertically and the z axis extends horizontally. For this reason, in addition to the membrane ring 4 as the joining element there is additionally provided a second membrane ring 4', which is connected to the lens on the side of the lens 7 opposite from the membrane ring 4, likewise via a rigid, moment-transferring connection 12'. In the case of this exemplary embodiment as well, centering elements are provided in the form of pins 16', which act on the outer circumference of the lens 7, distributed over the circumference. In this case, the pins 16' have an inverted T shape and are securely bonded on the circumference of the lens 7 via the T bars. The pins 16' are in turn inserted in bores in a supporting ring 17', which after the alignment of the lens 7 are filled with an adhesive to establish a secure connection between the pins 16' and the supporting ring 17'.

Serving for fastening the second membrane ring 4', which may likewise be provided with butt straps 6, is a retaining ring 18, by which the membrane ring 4', is simultaneously connected to the supporting ring 17' and the membrane ring 4 is securely connected to the mount 1.

Represented by way of example in FIGS. 7 to 11 are various types of butt straps 6 of the membrane ring 4 or 4'.

Figure 7:
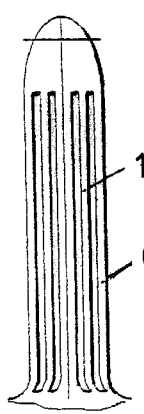
FIGS. 7 to 11 show various designs of butt straps of a membrane ring as the joining element.

FIG. 7 in this case show a form in which the butt strap is provided in the longitudinal direction with a structure 19.

Figure 8:
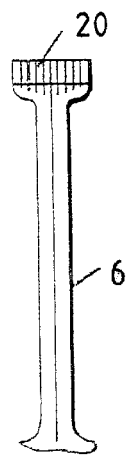

FIG. 8 shows in the region of the connection 12 to the lens 7 a comb structure or incisions 20. At the same time, FIG. 8 also shows a design of a butt strap 6 with a region of reduced width between the membrane ring 4 and the connection 12 in the front region.

Figure 9:
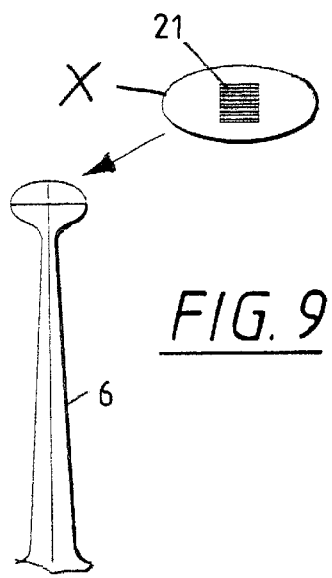

FIG. 9 shows a still greater constriction of a butt strap 6 with a concial progression to its front end, which serves as a connection 12 to the lens 7. In the enlargement of a detail X on the extra surface it is indicated that the front end of the butt strap 6 represented in FIG. 9 may be provided in the region of the connection 12 to the lens 7 with an etched grid structure 21. The etched grid structure 21 has the task of achieving better adhesive bonding that the connection 12, or it is consequently not absolutely necessary for the adhesive to be apportioned extremely accurately, since it can then escape into the grid structure 21. It goes without saying that such a grid structure 21 is also possible with other forms of butt strap.

Figure 10:
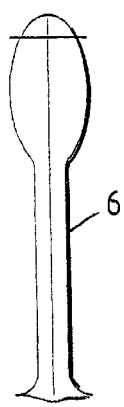

FIG. 10 shows a similar design of a butt strap 6 to that in FIG. 9, the only difference being that the constricted region is not as pronounced and the resting region for the connection 12 has an approximately elliptical shape, with a greater ellipse axis extending in the radial direction.

Figure 11:

FIG. 11 shows a simple rectangular design (likewise in plan view) of a butt strap 6. While, for example, wide butt straps, such as the butt straps 6 represented in FIGS. 7 and 11, are produced with a thinner metal sheet thickness, such as 0.1 to 0.3 mm for example, narrow, long butt straps 7 are produced with a greater metal sheet thickness, for example 0.3 to 0.5 mm.

What is claimed is:

1. An assembly comprising an optical element and a mount, in which the optical element is connected by elastic connecting elements directly to the mount, wherein each said connecting element has at least one radially disposed membrane-like joining element, which is connected in the outer region to the mount and in the inner region is connected via a rigid, moment-transferring connector to the optical element.

2. The assembly as claimed in claim 1, wherein the joining element ha a membrane ring or a plurality of membrane ring segments which can be put together to form a closed membrane ring.

3. The assembly as claimed in claim 1, wherein the joining element is provided on the inner circumference with butt straps, on which the optical element rests and via which the rigid, moment-transferring connection is established.

4. The assembly as claimed in claim 1, wherein the joining element comprises a thin spring-like metal sheet.

5. The assembly as claimed in claim 1, wherein the connection takes place in a positive or non-positive manner, selected from the group consisting of welding, soldering, adhesive bonding or clamping.

6. The assembly as claimed in claim 1, wherein the joining element has in the outer circuferential region, in which it is connected to the frame or one or more intermediate elements, slits extending approximately in the radial or tangential direction for isolation in terms of deformation.

7. The assembly as claimed in claim 6, wherein, if the joining element is designed as a membrane ring, the slits extend alternately from the outer circumference and from the inner circumference.

8. The assembly as claimed in claim 1, wherein the joining element is provided with the relief pockets, at least in the region in which it is connected to the mount or the one or more intermediate elements.

9. The assembly as claimed in claim 1, wherein the mount or an intermediate element to which the joining element is connected has in the region of the connection a resting contour corresponding to the bending line of the joining element.

10. The assembly as claimed in claim 1, wherein he joining element, in particular when designed with butt straps, is provided at least partly with a grid structure or comb structure in the region of the rigid, moment-transferring connection, which is created by adhesive bonding or soldering.

11. The assembly as claimed in claim 3, wherein the butt straps are structured on their surfaces.

12. The assembly as claimed in claim 3, wherein the butt straps have different widths over their length.

13. The assembly as claimed in claim 1, wherein the joining element is provided with the integration or application of an intelligent material.

14. The assembly as claimed in claim 1, wherein the joining system element consists of a material with elastic properties.

15. The assembly as claimed in claim 1, wherein the mount or an element connected to the mount is connected to a supporting ring, from which there protrude elements that are arranged in the supporting ring and are connected by their free ends to the optical element in such a way that an increase in rigidity perpendicular to or in the direction of the optical axis is obtained.

16. The assembly as claimed in claim 15, wherein the elements are adhesively bonded into bores in the supporting ring or are fastened by some other positive or non-positive connecting technique.

17. The assembly as claimed in claim 1, wherein the optical element is held by a second membrane-like joining element, which is arranged on the side facing away from the connection to the first joining element, via rigid, moment-transferring connection.

18. The assembly as claimed in claim 1, wherein the mount is provided with a centering collar for the joining element.

19. A method of connecting an optical element to a mount or an intermediate element connected to the mount, wherein a membrane-like joining element is fastened to the mount, after which the optical element is placed onto the joining element and is aligned on the joining element by a straightening and joining operation, after which the optical element is fixed on the joining element by a rigid, moment-transferring connection.

20. The method as claimed in claim 19, wherein the mount is clamped onto a rigid mating flange for installation.

21. An assembly comprising an optical element and a mount, in which the optical element is connected by one or more intermediate elements to the mount, and at least one radially directed membrane-like joining element having an inner circumference, said joining element being connected in the outer region to the mount or to the intermediate element or elements and in the inner region is connected via a rigid, moment-transferring connection to the optical element and wherein the joining element has a membrane ring or a plurality of membrane ring segments which can be put together to form a closed membrane ring, and butt straps are on the under circumferences of the joining element on which the optical element rests and via which the rigid, moment-transferring connection is established.

22. The assembly as claimed in claim 21, wherein the joining element comprises a thin spring-like metal sheet.

23. The assembly as claimed in claim 21, wherein the connection takes place in a positive or non-positive manner, selected from the group consisting of welding, soldering, adhesive bonding or clamping.

24. The assembly as claimed in claim 1, wherein the joining element has in the outer circuferential region, in which it is connected to the frame or one or more intermediate elements, slits extending approximately in the radial or tangential direction for isolation in terms of deformation.

25. The assembly as claimed in claim 24, wherein, if the joining element is designed as a membrane ring, the slits extend alternately from the outer circumference and from the inner circumference.

26. The assembly as claimed in claim 21, wherein the joining element is provided with the relief pockets, at least in the region in which it is connected to the mount or the one or more intermediate elements.

27. The assembly as claimed in claim 21, wherein the mount or an intermediate element to which the joining element is connected has in the region of the connection a resting contour corresponding to the bending line of the joining element.

28. The assembly as claimed in claim 21, wherein he joining element, in particular when designed with butt straps, is provided at least partly with a grid structure or comb structure in the region of the rigid, moment-transferring connection, which is created by adhesive bonding or soldering.

29. The assembly as claimed in claim 21, wherein the butt straps are structured on their surfaces.

30. The assembly as claimed in claim 21, wherein the butt straps have different widths over their length.

31. The assembly as claimed in claim 21, wherein the joining element is provided with the integration or application of an intelligent material.

32. The assembly as claimed in claim 21, wherein the joining system element consists of a material with elastic properties.

33. The assembly as claimed in claim 21, wherein the mount or an element connected to the mount is connected to a supporting ring, from which there protrude elements that are arranged in the supporting ring and are connected by their free ends to the optical element in such a way that an increase in rigidity perpendicular to or in the direction of the optical axis is obtained.

34. The assembly as claimed in claim 33, wherein the elements are adhesively bonded into bores in the supporting ring or are fastened by some other positive or non-positive connecting technique.

35. The assembly as claimed in claim 21, wherein the optical element is held by a second membrane-like joining element, which is arranged on the side facing away from the connection to the first joining element, via rigid, moment-transferring connection.

36. The assembly as claimed in claim 21, wherein the mount is provided with a centering collar for the joining element.

* * * * *

UNITED STATES PATENT AND TRADEMARK OFFICE
CERTIFICATE OF CORRECTION

PATENT NO. : 6,392,825 B1
DATED : May 21, 2002
INVENTOR(S) : Trunz et al.

It is certified that error appears in the above-identified patent and that said Letters Patent is hereby corrected as shown below:

<u>Title page,</u>
Item [56], ABSTRACT,
Line 1, between "mount (1)" and "and" insert a space <u>Column 3,</u>
Line 11, "butt straps 7" should be -- butt straps 6 --;

<u>Column 5,</u>
Line 2, "butt straps 7" should be -- butt straps 6 --;
Line 14, "ha" should be -- has --;
Line 28, "circuferential" should be -- circumferential --;
Line 45, "he" should be -- the --;

<u>Column 6,</u>
Line 43, "circuferential" should be -- circumferential --;
Line 60, "he" should be -- the --.

Signed and Sealed this

Twenty-fourth Day of December, 2002

JAMES E. ROGAN
*Director of the United States Patent and Trademark Office*